US012805127B2

(12) United States Patent
Cao et al.

(10) Patent No.: US 12,805,127 B2
(45) Date of Patent: Nov. 17, 2026

(54) FLEXIBLE DISPLAY PANEL AND FLEXIBLE ARRAY SUBSTRATE

(71) Applicant: Shenzhen China Star Optoelectronics Semiconductor Display Technology Co., Ltd., Shenzhen (CN)

(72) Inventors: Weiran Cao, Shenzhen (CN); Gaobo Lin, Shenzhen (CN); Yuanjun Hsu, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 1359 days.

(21) Appl. No.: 17/623,501

(22) PCT Filed: Dec. 20, 2021

(86) PCT No.: PCT/CN2021/139543

§ 371 (c)(1),
(2) Date: Jun. 15, 2023

(87) PCT Pub. No.: WO2023/103069

PCT Pub. Date: Jun. 15, 2023

(65) Prior Publication Data

US 2024/0049523 A1 Feb. 8, 2024

(30) Foreign Application Priority Data

Dec. 8, 2021 (CN) ......................... 202111488237.5

(51) Int. Cl.
*H10K 59/124* (2023.01)

(52) U.S. Cl.
CPC .................................. *H10K 59/124* (2023.02)

(58) Field of Classification Search
CPC ............ H10K 2102/311; H10K 77/111; H10K 59/124; H10K 59/00; H10K 50/80; Y02E 10/549
See application file for complete search history.

(56) References Cited

U.S. PATENT DOCUMENTS

| | | | | |
|---|---|---|---|---|
| 10,269,830 | B1 | 4/2019 | Hu | |
| 2017/0069701 | A1* | 3/2017 | Cai | H10K 59/1201 |

(Continued)

FOREIGN PATENT DOCUMENTS

| | | | |
|---|---|---|---|
| CN | 104795403 | A | 7/2015 |
| CN | 107424957 | A | 12/2017 |

(Continued)

OTHER PUBLICATIONS

International Search Report in International application No. PCT/CN2021/139543, mailed on Jul. 27, 2022.

(Continued)

*Primary Examiner* — Vongsavanh Sengdara
(74) *Attorney, Agent, or Firm* — PV IP PC; Peter Stetcher; Wei Te Chung

(57) ABSTRACT

A flexible display panel and a flexible array substrate are provided, which include a flexible substrate, a thin film transistor layer, and an organic planarization layer. The thin film transistor layer is disposed on the flexible substrate and in a display area and includes a plurality of insulating layers disposed in a stack, wherein, a surface of the thin film transistor layer away from the flexible substrate is provided with first through-holes penetrating at least one of the insulating layers. The organic planarization layer covers one side of the thin film transistor layer away from the flexible substrate and is filled in the first through-holes.

17 Claims, 4 Drawing Sheets

(56) References Cited

U.S. PATENT DOCUMENTS

| | | | | |
|---|---|---|---|---|
| 2018/0233682 | A1* | 8/2018 | Lin | B32B 15/08 |
| 2020/0201391 | A1* | 6/2020 | Bai | G06F 1/1652 |
| 2021/0343820 | A1* | 11/2021 | Ming | H10K 77/111 |

FOREIGN PATENT DOCUMENTS

| | | | |
|---|---|---|---|
| CN | 107658333 | A | 2/2018 |
| CN | 207409491 | U | 5/2018 |
| CN | 108400261 | A | 8/2018 |
| CN | 109166862 | A | 1/2019 |
| CN | 109166880 | A | 1/2019 |
| CN | 110610966 | A | 12/2019 |
| CN | 110690226 | A | 1/2020 |
| CN | 111244111 | A | 6/2020 |
| CN | 112490271 | A | 3/2021 |
| JP | 2021033257 | A | 3/2021 |

OTHER PUBLICATIONS

Written Opinion of the International Search Authority in International application No. PCT/CN2021/139543, mailed on Jul. 27, 2022.

Chinese Office Action issued in corresponding Chinese Patent Application No. 202111488237.5 dated Nov. 16, 2022, pp. 1-7.

* cited by examiner

FLEXIBLE DISPLAY PANEL AND FLEXIBLE ARRAY SUBSTRATE

CROSS-REFERENCE TO RELATED APPLICATION

This application is a national phase application under 35 U.S.C. § 371 of PCT Application No. PCT/CN2021/139543, filed Dec. 20, 2021, which claims priority to Chinese Application No. 202111488237.5, filed Dec. 8, 2021, the contents of which are incorporated herein by reference in their entirety.

FIELD OF INVENTION

The present disclosure relates to the field of display technologies, and more particularly, to a flexible display panel and a flexible array substrate.

BACKGROUND OF INVENTION

In recent years, since flexible display panels can be bent or rolled, the flexible display panels are able to be applied to various display requirements, and have more and more applications. In general, the flexible display panels include a plurality of inorganic insulating layers disposed in a stack. With higher and higher requirements to bendability of the flexible display panels, conventional structures of laminated inorganic insulating layers have been difficult to meet the requirements of the flexible display panels.

Technical problem: in view of this, the present disclosure provides a flexible display panel and a flexible array substrate that can improve bendability.

SUMMARY OF INVENTION

The present disclosure provides a flexible display panel, which has a display area and includes:

a flexible substrate;

a thin film transistor layer disposed on the flexible substrate and in the display area and including a plurality of insulating layers disposed in a stack, wherein, a surface of the thin film transistor layer away from the flexible substrate is provided with first through-holes penetrating at least one of the insulating layers; and an organic planarization layer covering one side of the thin film transistor layer away from the flexible substrate and filled in the first through-holes.

In an embodiment, the thin film transistor layer includes thin film transistors, and the first through-holes are defined adjacent to the thin film transistors.

In an embodiment, the insulating layers include a gate insulating layer, an interlayer insulating layer, a source and drain electrode layer, and a passivation layer, the thin film transistor layer further includes a semiconductor layer and a gate electrode layer, the semiconductor layer is disposed on the flexible substrate, the gate electrode layer is disposed on one side of the semiconductor layer away or adjacent to the flexible substrate, the gate insulating layer is disposed between the gate electrode layer and the semiconductor layer, the source and drain electrode layer is disposed on one side of the gate electrode layer and the semiconductor layer away from the flexible substrate, the interlayer insulating layer is disposed between the source and drain electrode layer and the semiconductor layer, the passivation layer is disposed on one side of the source and drain electrode layer away from the flexible substrate, and the first through-holes penetrate at least a part of the passivation layer or at least a part of the interlayer insulating layer.

In an embodiment, the flexible display panel further includes a buffer layer disposed between the insulating layers and the flexible substrate, and the first through-holes penetrate at least a part of the buffer layer.

In an embodiment, the flexible display panel further includes a barrier layer disposed between the thin film transistor layer and the flexible substrate;

wherein, the flexible substrate includes a first flexible substrate, a second flexible substrate, and a blocking layer, the second flexible substrate is disposed between the thin film transistor layer and the first flexible substrate, the blocking layer is disposed between the first flexible substrate and the second flexible substrate, the second flexible substrate is provided with second through-holes penetrating at least a part of the first flexible substrate, and the barrier layer is filled in the second through-holes.

In an embodiment, an orthographic projection of hole walls of the first through-holes on a plane that the first flexible substrate is located at least partially overlaps an orthographic projection of hole walls of the second through-holes on the plane that the first flexible substrate is located; or the orthographic projection of the hole walls of the first through-holes on the plane that the first flexible substrate is located is within the orthographic projection of the hole walls of the second through-holes on the plane that the first flexible substrate is located.

In an embodiment, when the first through-holes and the second through-holes are both circular holes, a diameter of the second through-holes is 4 microns greater than a diameter of the first through-holes.

In an embodiment, a depth of the second through-holes is greater than a depth of the first through-holes.

In an embodiment, the flexible substrate further includes an adhesive layer disposed between the blocking layer and the second flexible substrate, and the second through-holes penetrate the second flexible substrate to expose the adhesive layer or the blocking layer.

In an embodiment, the flexible display panel further includes a first electrode, a pixel definition layer, a light-emitting layer, and a second electrode, wherein, the first electrode is disposed on the thin film transistor layer, the pixel definition layer is disposed on one side of the first electrode away from the thin film transistor layer, the pixel definition layer is provided with openings, the light-emitting layer is disposed in the openings, and the second electrode covers the pixel definition layer and the light-emitting layer.

The present disclosure further provides a flexible array substrate, which has a display area and includes:

a flexible substrate;

a thin film transistor layer disposed on the flexible substrate and in the display area and including a plurality of insulating layers disposed in a stack, wherein, a surface of the thin film transistor layer away from the flexible substrate is provided with first through-holes penetrating at least one of the insulating layers; and an organic planarization layer covering one side of the thin film transistor layer away from the flexible substrate and filled in the first through-holes.

In an embodiment of the flexible array substrate, the thin film transistor layer includes thin film transistors, and the first through-holes are defined adjacent to the thin film transistors.

In an embodiment of the flexible array substrate, the insulating layers include a gate insulating layer, an interlayer insulating layer, a source and drain electrode layer, and a passivation layer, the thin film transistor layer further includes a semiconductor layer and a gate electrode layer, the semiconductor layer is disposed on the flexible substrate, the gate electrode layer is disposed on one side of the semiconductor layer away or adjacent to the flexible substrate, the gate insulating layer is disposed between the gate electrode layer and the semiconductor layer, the source and drain electrode layer is disposed on one side of the gate electrode layer and the semiconductor layer away from the flexible substrate, the interlayer insulating layer is disposed between the source and drain electrode layer and the semiconductor layer, the passivation layer is disposed on one side of the source and drain electrode layer away from the flexible substrate, and the first through-holes penetrate at least a part of the passivation layer or at least a part of the interlayer insulating layer.

In an embodiment of the flexible array substrate, the flexible array substrate further includes a buffer layer disposed between the insulating layers and the flexible substrate, wherein, the first through-holes penetrate at least a part of the buffer layer.

In an embodiment of the flexible array substrate, the flexible array substrate further includes a barrier layer disposed between the thin film transistor layer and the flexible substrate;

- wherein, the flexible substrate includes a first flexible substrate, a second flexible substrate, and a blocking layer, the second flexible substrate is disposed between the thin film transistor layer and the first flexible substrate, the blocking layer is disposed between the first flexible substrate and the second flexible substrate, the second flexible substrate is provided with second through-holes penetrating at least a part of the first flexible substrate, and the barrier layer is filled in the second through-holes.

In an embodiment of the flexible array substrate, an orthographic projection of hole walls of the first through-holes on a plane that the first flexible substrate is located at least partially overlaps an orthographic projection of hole walls of the second through-holes on the plane that the first flexible substrate is located; or

- the orthographic projection of the hole walls of the first through-holes on the plane that the first flexible substrate is located is within the orthographic projection of the hole walls of the second through-holes on the plane that the first flexible substrate is located.

In an embodiment of the flexible array substrate, when the first through-holes and the second through-holes are both circular holes, a diameter of the second through-holes is 4 microns greater than a diameter of the first through-holes.

In an embodiment of the flexible array substrate, a depth of the second through-holes is greater than a depth of the first through-holes.

In an embodiment of the flexible array substrate, the flexible array substrate further includes an adhesive layer disposed between the blocking layer and the second flexible substrate, and the second through-holes penetrate the second flexible substrate to expose the adhesive layer or the blocking layer.

Beneficial effect: the present disclosure defines the first through-holes in the insulating layers of the thin film transistor layer, so when a bending force is applied to the flexible display panel, stresses will act in the first through-holes, thereby effectively reducing bending damages to the flexible display panel and improving bending performances of products. Further, filling the organic planarization layer in the first through-holes, that is, replacing inorganic materials in the insulating layers with organic materials, can further improve a bending resistance, thereby greatly improving physical bendability of the flexible display panel.

DESCRIPTION OF DRAWINGS

The accompanying figures to be used in the description of embodiments of the present disclosure will be described in brief to more clearly illustrate the technical solutions of the embodiments. Obviously, the accompanying figures described below are only part of the embodiments of the present disclosure, from which those skilled in the art can derive further figures without making any inventive efforts.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all embodiments. Based on the embodiments in the present disclosure, all other embodiments obtained by those skilled in the art without creative efforts are within the scope of the present disclosure.

In the description of the present disclosure, unless specified or limited otherwise, it should be noted that, a structure in which a first feature is “on” or “beneath” a second feature may include an embodiment in which the first feature directly contacts the second feature and may also include an embodiment in which an additional feature is formed between the first feature and the second feature so that the first feature does not directly contact the second feature. Furthermore, a first feature “on,” “above,” or “on top of” a second feature may include an embodiment in which the first feature is right “on,” “above,” or “on top of” the second feature and may also include an embodiment in which the first feature is not right “on,” “above,” or “on top of” the second feature, or just means that the first feature has a sea level elevation greater than the sea level elevation of the second feature. While first feature “beneath,” “below,” or “on bottom of” a second feature may include an embodiment in which the first feature is right “beneath,” “below,” or “on bottom of” the second feature and may also include an embodiment in which the first feature is not right “beneath,” “below,” or “on bottom of” the second feature, or just means that the first feature has a sea level elevation less than the sea level elevation of the second feature. In addition, terms such as “first” and “second” are used herein for purposes of description and are not intended to indicate or imply relative importance or implicitly indicating the number of technical features indicated. Thus, features limited by "first" and "second" are intended to indicate or imply including one or more than one these features.

The present disclosure provides a flexible display panel. The flexible display panel in the embodiment of the present disclosure may be applied to mobile phones, tablet computers, e-readers, electronic display screens, notebook computers, augmented reality (AR)/virtual reality (VR) devices, media players, wearable devices, digital cameras, car navigation systems, etc.

The flexible display panel may be an organic light-emitting diode (OLED) display panel, a quantum dot light-emitting diode (QLED) display panel, a micro light-emitting diode (Micro-LED) display panel, a mini light-emitting diode (Mini-LED) display panel, or a liquid crystal display panel.

A flexible array substrate of the OLED display panel is taken as an example for description in the following.

Figure 1:
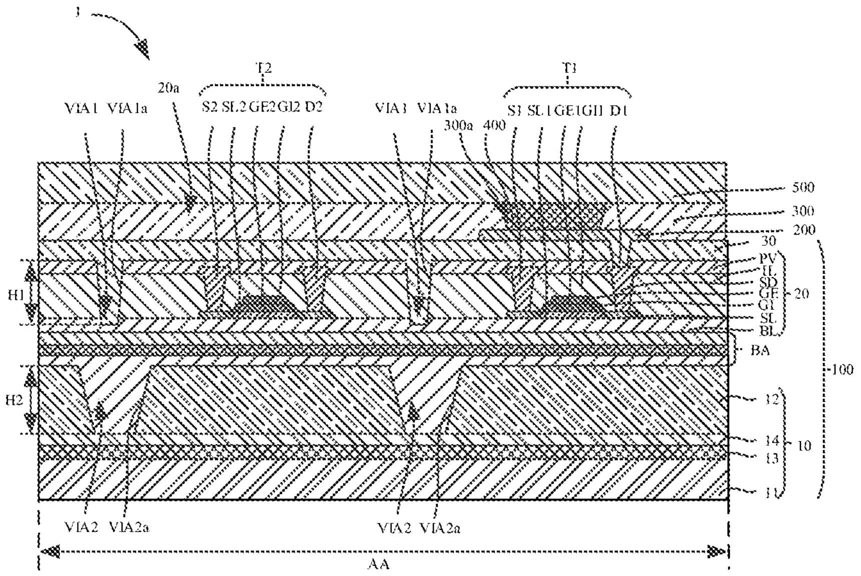
FIG. 1 is a schematic structural diagram of a flexible display panel according to a first embodiment of the present disclosure.

Referring to FIG. 1, The flexible display panel 1 includes a display area AA. It can be understood that the flexible display panel 1 also includes a non-display area (not shown in the figures) surrounding the display area AA. In the present disclosure, the "display area AA" means an area configured to dispose light-emitting devices and pixel driving circuits of the light-emitting devices, that is, an area composed of all pixel areas. An area surrounding the display area AA is the non-display area. The flexible display panel 1 includes a flexible array substrate 100. The flexible array substrate 100 includes a flexible substrate 10, a thin film transistor layer 20 disposed on the flexible substrate 10 and located in the display area AA, and an organic planarization layer 30 covering one side of the thin film transistor layer 20 away from the flexible substrate 10. The thin film transistor layer 20 includes a plurality of insulating layers arranged in a stack. The insulating layers include a passivation layer PV, an interlayer insulating layer IL, etc. A surface 20*a* of the thin film transistor layer 20 away from the flexible substrate 10 is provided with first through-holes VIA1. The first through-holes VIA1 penetrate at least one of the insulating layers. The organic planarization layer 30 is filled in the first through-holes VIA1. The organic planarization layer 30 may be an organic photoresist material.

The present disclosure defines the first through-holes VIA1 in the insulating layers of the thin film transistor layer 20, so when a bending force is applied to the flexible array substrate 100, stresses will act in the first through-holes VIA1, thereby effectively reducing bending damages to the flexible array substrate 100 and improving bending performances of products. Further, filling the organic planarization layer 30 in the first through-holes VIA1, that is, replacing inorganic materials in the insulating layers with organic materials, can further improve a bending resistance, thereby greatly improving physical bendability of the flexible array substrate 100.

Further, the thin film transistor layer 20 includes a plurality of thin film transistors. The first through-holes VIA1 are defined adjacent to the thin film transistors. A number and position of the first through-holes VIA1 are not limited in the present disclosure. Optionally, at least one first through-hole VIA1 may be set around each of the thin film transistors. It may also be that a plurality of first through-holes VIA1 be set around one thin film transistor. By setting the first through-holes VIA1 around the thin film transistors, the thin film transistors can be more effectively protected, thereby improving reliability of the thin film transistors. The thin film transistors are disposed at intervals, and the first through-holes VIA1 are set among the thin film transistors. In another words, the first through-holes VIA1 and each of the thin film transistors in the thin film transistor layer 20 are staggered from each other, thereby preventing from affecting the thin film transistors when bending.

Specifically, driving circuits of the OLED display panel may be 2T1C, 3T1C, 5T1C, or 7T1C circuits. The driving circuit of FIG. 1 is a 2T1C pixel driving circuit, so the thin film transistors include driving thin film transistors T1 and switch thin film transistors T2. It can be understood that according to different types of the driving circuits, the thin film transistor layer 20 may also include other thin film transistors. As shown in FIG. 1, one first through-hole VIA1 is set adjacent to a driving thin film transistor T1, and another first through-hole VIA1 is set adjacent to a switch thin film transistor T2.

Viewed from a direction perpendicular to the flexible substrate 10, the thin film transistor layer 20 includes a semiconductor layer SL, a gate insulating layer GI, a gate electrode layer GE, an interlayer insulating layer IL, a source and drain electrode layer SD, and a passivation layer PV. The semiconductor layer SL is disposed on the flexible substrate 10, the gate electrode layer GE is disposed on one side of the semiconductor layer SL away or adjacent to the flexible substrate 10, the gate insulating layer GI is disposed between the gate electrode layer GE and the semiconductor layer SL, the source and drain electrode layer SD is disposed on one side of the gate electrode layer GE and the semiconductor layer SL away from the flexible substrate 10, the interlayer insulating layer IL is disposed between the source and drain electrode layer SD and the semiconductor layer SL, the passivation layer PV is disposed on one side of the source and drain electrode layer SD away from the flexible substrate 10, and the first through-holes VIA1 penetrate at least a part of the passivation layer PV or at least a part of the interlayer insulating layer IL. The first through-holes VIA1 penetrating at least a part of the passivation layer PV means that the first through-holes VIA1 may penetrate a part of the passivation layer PV, or may also completely penetrate through the passivation layer PV. The first through-holes VIA1 penetrating at least a part of the interlayer insulating layer IL means that the first through-holes VIA1 may completely penetrate through the passivation layer PV and a part of the interlayer insulating layer IL, or may also completely penetrate through the passivation layer PV and the interlayer insulating layer IL. According to a depth of the first through-holes VIA1 and different film layers that are penetrated, the first through-holes VIA1 can be formed by etching with one photomask or can be formed by etching with two or more photomasks.

Figure 2:
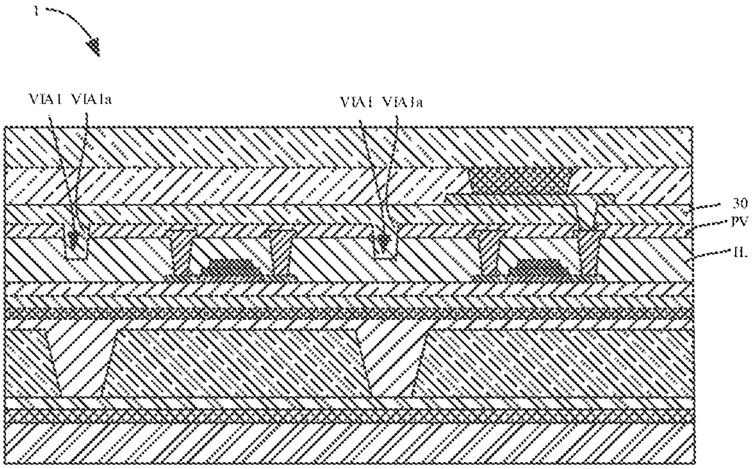
FIG. 2 is a schematic structural diagram of the flexible display panel according to a second embodiment of the present disclosure.
Figure 3:
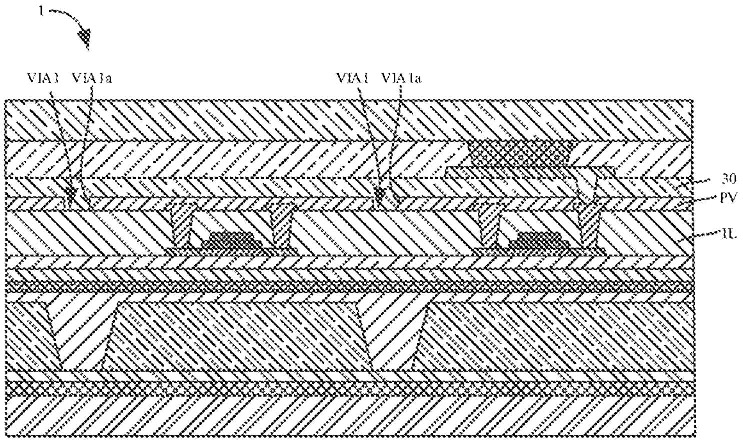
FIG. 3 is a schematic structural diagram of the flexible display panel according to a third embodiment of the present disclosure.

Optionally, as shown in FIG. 1, the thin film transistors of the present disclosure are top-gate thin film transistors. Specifically, they may be self-alignment thin film transistors. The semiconductor layer SL is disposed on one side of the gate electrode layer GE adjacent to the flexible substrate 10, and the first through-holes VIA1 completely penetrate through the passivation layer PV and the interlayer insulating layer IL. Further, the flexible array substrate 100 further includes a buffer layer BL disposed between the thin film transistor layer 20 and the flexible substrate 10. Further, the buffer layer BL is disposed between the insulating layers and the flexible substrate 10. The first through-holes VIA1 penetrate at least a part of the buffer layer BL. Further, a barrier layer BA is disposed between the buffer layer BL and the flexible substrate 10. In order to maintain water and oxygen barrier effects of the barrier layer BA, the first through-holes VIA1 do not penetrate the barrier layer BA. As shown in FIG. 2, the first through-holes VIA1 completely penetrate through the passivation layer PV and the part of the interlayer insulating layer IL. As shown in FIG. 3, the first through-holes VIA1 completely penetrate through the passivation layer PV.

Specifically, the gate electrode layer GE includes a first gate electrode GE1 and a second gate electrode GE2 that are spaced apart. The gate insulating layer GI includes a first gate insulating layer GI1 and a second gate insulating layer GI2 that are spaced apart. The semiconductor layer SL includes a first semiconductor layer SL1 and a second semiconductor layer SL2 that are spaced apart. The source and drain electrode layer SD includes a first source electrode S1, a first drain electrode D1, a second source electrode S2, and a second drain electrode D2 that are spaced apart.

The first semiconductor layer SL1 is disposed on the flexible substrate 10, the first gate insulating layer GI1 is disposed on a surface of the first semiconductor layer SL1 away from the flexible substrate 10, the first gate electrode GE1 is disposed on a surface of the first gate insulating layer GI1 away from the first semiconductor layer SL1, the first source electrode S1 and the first drain electrode D1 are disposed on one side of the first gate electrode GE1 away from the first semiconductor layer SL1, and the first source electrode S1 and the first drain electrode D1 are respectively connected to two ends of the first semiconductor layer SL1 by contact holes defined in the interlayer insulating layer IL. The first semiconductor layer SL1 may include a semiconductor channel and conductor parts located on both sides of the semiconductor channel. The first source electrode S1 and the first drain electrode D1 are respectively connected to the two conductor parts of the first semiconductor layer SL1. The driving thin film transistor T1 includes the first semiconductor layer SL1, the first gate insulating layer GI1, the first gate electrode GE1, the first source electrode S1, and the first drain electrode D1.

The second semiconductor layer SL2 is disposed on the flexible substrate 10, the second gate insulating layer GI2 is disposed on a surface of the second semiconductor layer SL2 away from the flexible substrate 10, the second gate electrode GE2 is disposed on a surface of the second gate insulating layer GI2 away from the second semiconductor layer SL2, the second source electrode S2 and the second drain electrode D2 are disposed on one side of the second gate electrode GE2 away from the second semiconductor layer SL2, and the second source electrode S2 and the second drain electrode D2 are respectively connected to two ends of the second semiconductor layer SL2 by another contact holes defined in the interlayer insulating layer IL. The second semiconductor layer SL2 may include a semiconductor channel and conductor parts located on both sides of the semiconductor channel. The second source electrode S2 and the second drain electrode D2 are respectively connected to the two conductor parts of the second semiconductor layer SL2. The switch thin film transistor T2 includes the second semiconductor layer SL2, the second gate insulating layer GI2, the second gate electrode GE2, the second source electrode S2, and the second drain electrode D2.

In other embodiments of the present disclosure, the thin film transistors may also be bottom-gate thin film transistors. According to structural differences of the thin film transistors, when the gate insulating layer GI covers an entire surface of the flexible substrate 10, the first through-holes VIA1 may penetrate through the gate insulating layer GI.

The flexible substrate 10 includes a first flexible substrate 11, a second flexible substrate 12, a blocking layer 13, and an adhesive layer 14. The second flexible substrate 12 is disposed between the thin film transistor layer 20 and the first flexible substrate 11. The blocking layer 13 is disposed between the first flexible substrate 11 and the second flexible substrate 12 to block water vapor. The adhesive layer 14 is disposed between the blocking layer 13 and the second flexible substrate 12 to improve adhesion between the second flexible substrate 12 and the blocking layer 13. A material of a flexible organic layer is selected from one or more of polyimide (PI), polyethylene naphthalate (PEN), polyethylene terephthalate (PET), polyarylate (PAR), polycarbonate (PC), polyetherimide (PEI), or polyethersulfone (PES). A material of the blocking layer 13 is selected from one or more of inorganic materials such as silicon oxide, silicon nitride, or silicon oxynitride. A material of the adhesive layer 14 may be amorphous silicon (a-si).

Optionally, the second flexible substrate 12 is provided with second through-holes VIA2. The second through-holes VIA2 penetrate at least a part of the first flexible substrate 11. The second through-holes VIA2 penetrating at least a part of the first flexible substrate 11 means that the second through-holes VIA2 penetrate a part of the first flexible substrate 11, or the second through-holes VIA2 completely penetrate the first flexible substrate 11. The second through-holes VIA2 may penetrate through the second flexible substrate 12 to expose the adhesive layer 14 or the blocking layer 13. The barrier layer BA is filled in the second through-holes VIA2. A design of the second through-holes VIA2 is used to relieve stress when the second flexible substrate 12 is bent. Further, an orthographic projection of hole walls VIA1*a* of the first through-holes VIA1 on a plane that the first flexible substrate 11 is located at least partially overlaps an orthographic projection of hole walls of the second through-holes VIA2 on the plane that the first flexible substrate 11 is located; or the orthographic projection of the hole walls of the first through-holes VIA1 on the plane that the first flexible substrate 11 is located is within the orthographic projection of the hole walls of the second through-holes VIA2 on the plane that the first flexible substrate 11 is located. In another words, the first through-holes VIA1 are disposed corresponding to the second through-holes VIA2. By designing the first through-holes VIA1 to be correspond to the second through-holes VIA2, deep holes can be formed, which will help stresses release in the deep holes, thereby reducing effects of bending on the thin film transistors nearby. If the first through-holes VIA1 and the second through-holes VIA2 are staggered from each other, it will increase space on one hand, and on the other hand, it may affect the thin film transistors due to dislocation of stress release. When the orthographic projection of the hole walls of the first through-holes VIA1 on the plane that the first flexible substrate 11 is located is within the orthographic projection of the hole walls of the second through-holes VIA2 on the plane that the first flexible substrate 11 is located, a pore size of the first through-holes VIA1 is smaller than a pore size of the second through-holes VIA2. The pore sizes of the first through-holes VIA1 and the second through-holes VIA2 both refer to a biggest pore size of the through-holes. The pore size of the first through-holes VIA1 being designed to be smaller than the pore size of the second through-holes VIA2 is mainly to consider alignment and overlap of the first through-holes VIA1 and the second through-holes VIA2. Optionally, in order to ensure the alignment between the first through-holes VIA1 and the second through-holes VIA2 and to consider alignment accuracy, compared with the first through-holes VIA1, the second through-holes VIA2 are allowed an alignment error of about 2 microns. That is, when the first through-holes VIA1 and the second through-holes VIA2 are both circular holes, a diameter of the second through-holes VIA2 is 4 microns greater than a diameter of the first through-holes VIA1, which can ensure the alignment between the two. Optionally, a depth H2 of the second through-holes VIA2 is greater than a depth H1 of the first through-holes VIA1. If depths of through-holes are greater, effects of relieving stresses are greater. By setting the depth H2 of the second through-holes VIA2 greater than the depth H1 of the first through-holes VIA1, the stresses will concentrate in the second through-holes VIA2 when bending, thereby preventing the stresses from concentrating in the first through-holes VIA1 and affecting the thin film transistors. Specifically, the depth H2 of the second through-holes VIA2 ranges from 4 microns to 6 microns. It can be understood that shapes of the first through-holes VIA1 and the second through-holes VIA2 are not limited in the present disclosure, and the first through-holes VIA1 and the second through-holes VIA2 may be rectangular holes, square holes, or circular holes.

In addition to the flexible array substrate 100 described above, the flexible display panel 1 further includes a first electrode 200, a pixel definition layer 300, a light-emitting layer 400, and a second electrode 500. The first electrode 200 is disposed on the flexible array substrate 100, the pixel definition layer 300 is disposed on one side of the first electrode 200 away from the flexible array substrate 100, the pixel definition layer 300 is provided with openings 300*a*, the light-emitting layer 400 is disposed in the openings 300*a*, and the second electrode 500 covers the pixel definition layer 300 and the light-emitting layer 400. The first electrode 200 may be an anode and the second electrode 500 may be a cathode; or the first electrode 200 may be a cathode and the second electrode 500 may be an anode.

Figure 4:
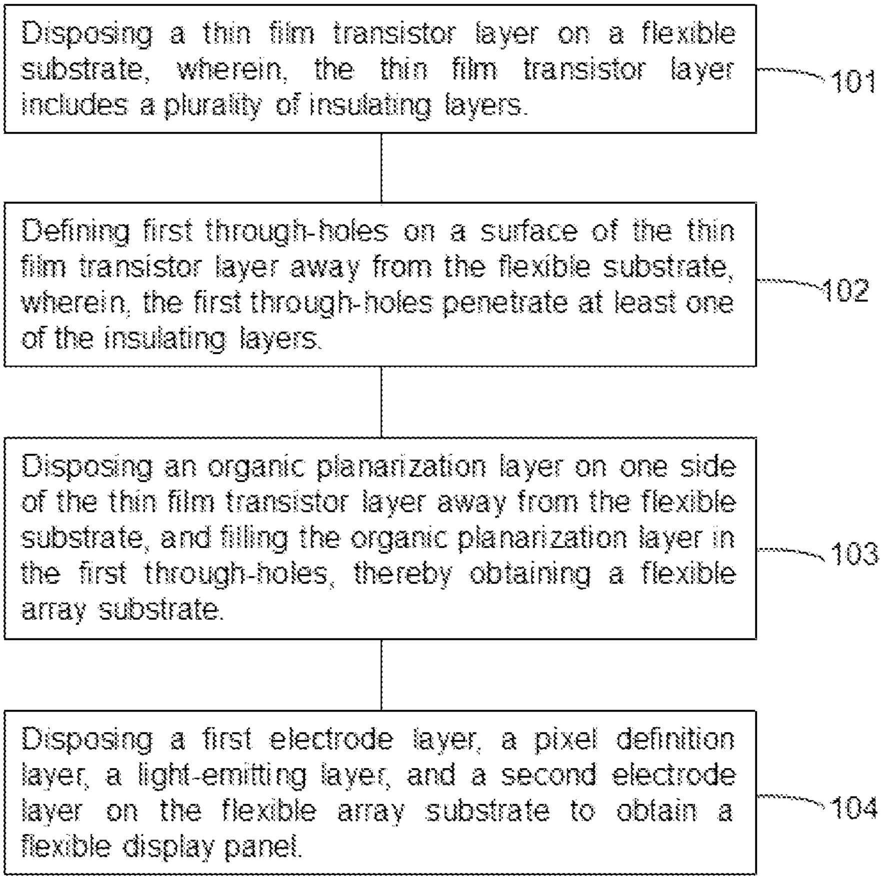
FIG. 4 is a flowchart of a manufacturing method of the flexible display panel according to the present disclosure.
Figure 5A:
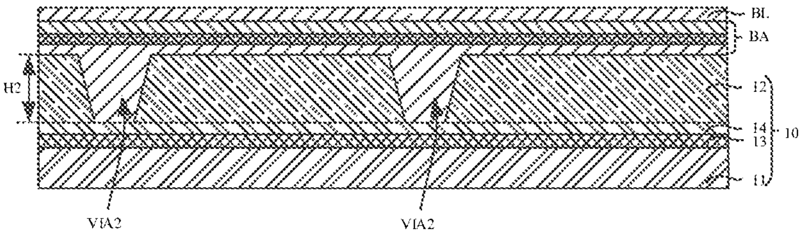
FIGS. 5(*a*) to 5(*d*) are schematic structural diagrams of the manufacturing method of the flexible display panel according to the present disclosure.
Figure 5B:
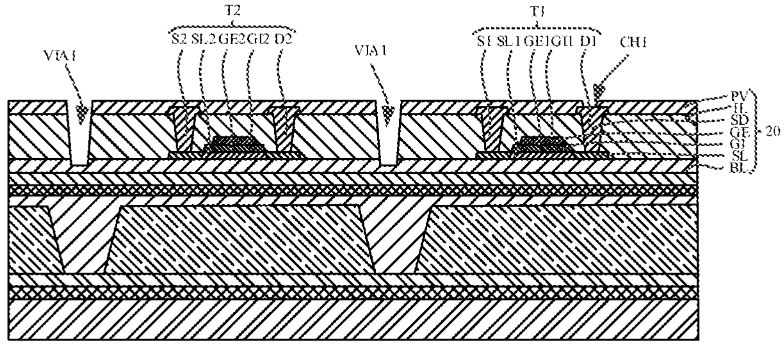
Figure 5C:
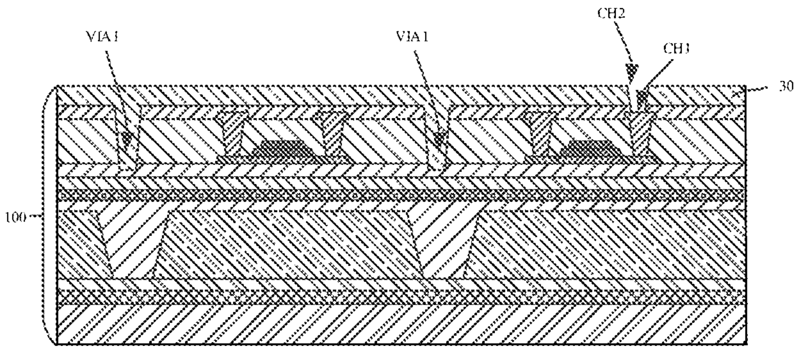
Figure 5D:
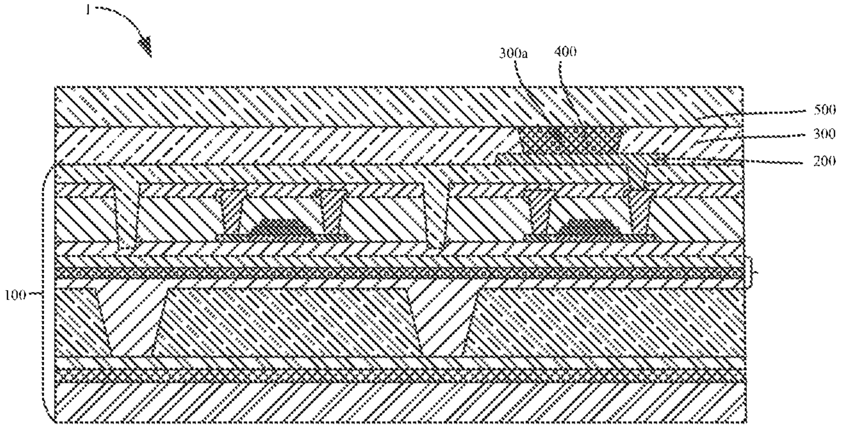

The present disclosure also provides a manufacturing method of a flexible display panel, which is used for manufacturing the above-mentioned flexible display panel. As shown in FIG. 4, the manufacturing method of the flexible display panel includes following steps:

Step 101: disposing the thin film transistor layer on the flexible substrate, wherein the thin film transistor layer includes the plurality of insulating layers.

The insulating layers include the passivation layer, the interlayer insulating layer, etc. The thin film transistor layer includes the plurality of thin film transistors. The thin film transistors include the driving thin film transistors and the switch thin film transistors. The thin film transistors are arranged at intervals.

Optionally, in the step 101: before the step of disposing the thin film transistor layer on the flexible substrate, the method may also include:

disposing the buffer layer on the flexible array substrate and disposing the barrier layer on the buffer layer.

Optionally, the step 101 may also include:

Step 1011: defining the second through-holes in the second flexible substrate, wherein the second through-holes penetrate at least a part of the first flexible substrate, and the barrier layer is filled in the second through-holes. The design of the second through-holes is used to relieve stress when the second flexible substrate is bent.

Further, in step 102, defining the first through-holes corresponding to the second through-holes. The orthographic projection of the hole walls of the first through-holes on the plane that the first flexible substrate is located at least partially overlaps the orthographic projection of the hole walls of the second through-holes on the plane that the first flexible substrate is located; or the orthographic projection of the hole walls of the first through-holes on the plane that the first flexible substrate is located is within the orthographic projection of the hole walls of the second through-holes on the plane that the first flexible substrate is located.

By designing the first through-holes to be correspond to the second through-holes, the deep holes can be formed, which will help stresses release in the deep holes, thereby reducing effects of bending on the thin film transistors nearby. If the first through-holes and the second through-holes are staggered from each other, it will increase space on one hand, and on the other hand, it may affect the thin film transistors due to dislocation of stress release. When the orthographic projection of the hole walls of the first through-holes on the plane that the first flexible substrate is located is within the orthographic projection of the hole walls of the second through-holes on the plane that the first flexible substrate is located, the pore size of the first through-holes is smaller than the pore size of the second through-holes. The pore size of the first through-holes being designed to be smaller than the pore size of the second through-holes is mainly to consider alignment and overlap of the first through-holes and the second through-holes. Optionally, in order to ensure the alignment between the first through-holes and the second through-holes and to consider alignment accuracy, compared with the first through-holes, the second through-holes are allowed an alignment error of about 2 microns. That is, when the first through-holes and the second through-holes are both circular holes, the diameter of the second through-holes is 4 microns greater than the diameter of the first through-holes, which can ensure the alignment between the two. Optionally, the depth of the second through-holes is greater than the depth of the first through-holes. If depths of through-holes are greater, effects of relieving stresses are greater. By setting the depth of the second through-holes greater than the depth of the first through-holes, the stresses will concentrate in the second through-holes when bending, thereby preventing the stresses from concentrating in the first through-holes and affecting the thin film transistors. Specifically, the depth of the second through-holes ranges from 4 microns to 6 microns. It can be understood that the shapes of the first through-holes VIA1 and the second through-holes VIA2 are not limited in the present disclosure, and the first through-holes VIA1 and the second through-holes VIA2 may be rectangular holes, square holes, or circular holes.

Step 102: defining the first through-holes on a surface of the thin film transistor layer away from the flexible substrate, wherein the first through-holes penetrate at least one of the insulating layers.

The first through-holes are set among the thin film transistors. The first through-holes and each of the thin film transistors in the thin film transistor layer are staggered from each other. By setting the first through-holes around the thin film transistors, the thin film transistors can be more effectively protected, thereby improving reliability of the thin film transistors. The number and position of the first through-holes are not limited in the present disclosure. Optionally, at least one first through-hole may be set around each of the thin film transistors.

Optionally, the first through-holes penetrate at least a part of the passivation layer, or the first through-holes penetrate at least a part of the interlayer insulating layer. Further, the first through-holes penetrate at least a part of the buffer layer. Specifically, the first through-holes penetrate a part of the buffer layer. In order to maintain water and oxygen barrier effects of the barrier layer, the first through-holes do not penetrate the barrier layer.

Step 103: disposing the organic planarization layer on one side of the thin film transistor layer away from the flexible substrate, and filling the organic planarization layer in the first through-holes, thereby obtaining the flexible array substrate.

In the step 103, the organic planarization layer may be an organic photoresist material.

The step of disposing the organic planarization layer on the side of the thin film transistor layer away from the flexible substrate specifically includes:

disposing an organic photoresist layer on the side of the thin film transistor layer away from the flexible substrate, and defining electrode connecting holes in the organic photoresist layer.

Step 104: disposing the first electrode layer, the pixel definition layer, the light-emitting layer, and the second electrode layer on the flexible array substrate to obtain the flexible display panel.

Specific examples are used to illustrate the implementation of the present disclosure in the following.

A manufacturing method of the flexible array substrate of an embodiment of the present disclosure includes following steps.

Step 201: referring to FIG. 5(*a*), providing the flexible substrate 10, wherein the flexible substrate 10 includes the first flexible substrate 11, the blocking layer 13, the adhesive layer 14, and the second flexible substrate 12 laminated in sequence. Wherein, the first flexible substrate 11 and the second flexible substrate 12 are made of polyimide, the blocking layer 13 is made of silicon oxide, and the adhesive layer 14 is made of amorphous silicon. a thickness of the second flexible substrate 12 ranges from 5 microns to 10 microns. The second through-holes VIA2 are defined in the second flexible substrate 12 by photolithography. The second through-holes VIA2 penetrate through the second flexible substrate 12 to expose the adhesive layer 14.

The depth H2 of the second through-holes VIA2 ranges from 4 microns to 6 microns.

Step 202: referring to FIG. 5(*a*), depositing the barrier layer BA on the flexible substrate 10, and disposing the buffer layer BL on the barrier layer BA. The barrier layer BA includes layers of silicon oxide, silicon nitride, and silicon oxide that are sequentially stacked. A total thickness of the barrier layer BA ranges from 1000 angstroms to 5000 angstroms.

Step 203: referring to FIG. 5(*b*), disposing a semiconductor material layer (not shown in the figures) on the buffer layer BL, wherein the semiconductor material layer includes a first semiconductor material layer and a second semiconductor material layer. A material of the semiconductor material layer may be IGZO, ITZO or IGZTO. A thickness of the semiconductor layer SL ranges from 100 angstroms to 1000 angstroms.

Step 204: depositing a gate insulating material layer on the semiconductor layer SL, wherein, a material of the gate insulating material layer is silicon oxide, and a thickness of the gate insulating material layer ranges from 1000 angstroms to 3000 angstroms.

Step 205: depositing a gate electrode metal layer on the gate insulating layer GI, wherein, a material of the gate electrode metal layer may be single layered Mo, Al, Cu, or Ti, or may be laminated metal of Mo/Al/Mo, Al/Mo, Mo/Cu, or MoTi/Cu, and a thickness of the gate electrode metal layer ranges from 500 angstroms to 10000 angstroms.

Step 206: defining the gate electrode layer GE and the gate insulating layer GI by one mask. The gate insulating layer GI includes the first gate insulating layer GI1 and the second gate insulating layer GI2. The first gate insulating layer GI1 is disposed on the first semiconductor layer SL1. The second gate insulating layer GI2 is disposed on the second semiconductor layer SL2. The gate electrode layer GE includes the first gate electrode layer GE1 and the second gate electrode layer GE2. The first gate electrode layer GE1 is located on the first gate insulating layer GI1. The second gate electrode layer GE2 is located on the second gate insulating layer GI2. Specifically, the gate electrode metal layer is etched first by wet etching, and then the gate insulating layer GI is dry etched using self-alignment of patterned first gate electrode GE1 and second gate electrode GE2 to obtain the first gate insulating layer GI1 and the second gate insulating layer GI2.

Step 207: conductorizing the semiconductor material layer that is not protected by the gate insulating layer GI by plasma to form N-doped conductor areas, which act as a source electrode area and a drain electrode area to be in contact with the source electrode and the drain electrode. The semiconductor material layer under the gate insulating layer GI is not treated and acts as channels of the thin film transistors, thereby forming the semiconductor layer SL including the first semiconductor layer SL1 and the second semiconductor layer SL2.

Step 208: depositing a silicon oxide film as the interlayer insulating layer IL, wherein, a thickness thereof ranges from 3000 angstroms to 10000 angstroms, and the interlayer insulating layer IL is etched to form contact holes of the source electrode, the drain electrode, and the semiconductor layer SL. At a same time, buffer holes may also be etched to form the first through-holes subsequently. The buffer holes are located between the first semiconductor layer SL1 and the second semiconductor layer SL2.

Step 209: depositing source and drain metal layer, wherein, a material of the source and drain metal layer may be Mo, Al, Cu, or Ti, or an alloy of Mo, Al, Cu, or Ti, and a thickness of the source and drain metal layer ranges from 2000 angstroms to 10000 angstroms. By photolithography, the source and drain metal layer forms the first source electrode S1, the first drain electrode D1, the second source electrode S2, and the second drain electrode D2 that are spaced apart. The first source electrode S1 and the first drain electrode D1 are respectively connected to both ends of the first semiconductor layer SL1 by vias defined in the interlayer insulating layer IL. The second source electrode S2 and the second drain electrode D2 are respectively connected to both ends of the second semiconductor layer SL2 by the contact holes defined in the interlayer insulating layer IL.

Step 210: depositing the passivation layer PV, wherein, the passivation layer PV may be a silicon oxide film, and a thickness of the passivation layer PV ranges from 1000 angstroms to 5000 angstroms. Based on the buffer holes, the passivation layer PV is etched to form the first through-holes VIA1 and a first contact hole CH1 at a same time. The first contact hole CH1 penetrates through the passivation layer PV to expose the first drain electrode D1.

Step 211: referring to FIG. 5(*c*), depositing the organic photoresist material as the organic planarization layer 30. The organic planarization layer 30 may be a photoresist layer having different ingredients, a thickness thereof ranges from 10000 angstroms to 50000 angstroms, and the organic planarization layer 30 is filled in the first through-holes VIA1. In addition, in the step 211, a second contact hole CH2 and the first contact hole CH1 may be formed on the organic planarization layer 30 by photolithography, thereby obtaining the flexible array substrate 100.

Step 212: referring to FIG. 5(*d*), depositing the first electrode 200, wherein, the first electrode 200 is an anode, the first electrode 200 includes a metal material having a high reflectivity, which includes but is not limited to ITO/Ag/ITO, IZO/Ag/IZO, ITO/Al/ITO, or IZO/Al/IZO, and the first electrode 200 is connected to the driving thin film transistors T1 by the first contact hole CH1 and the second contact hole CH2.

Step 213: disposing the pixel definition layer 300, wherein, a thickness of the pixel definition layer 300 ranges from 10000 angstroms to 20000 angstroms, and the pixel definition layer 300 is defined with an opening 300*a* by photolithography.

Step 214: disposing the light-emitting layer 400 in the opening 300*a*.

Step 215: disposing the second electrode 500 on the light-emitting layer 400 and the pixel definition layer 300, wherein, the second electrode 500 is a cathode, thereby obtaining the flexible display panel.

The embodiments of the present disclosure are described in detail above. Specific examples are used herein to explain the principles and implementation of the present disclosure. The descriptions of the above embodiments are only used to help understand the present disclosure. Meanwhile, for those skilled in the art, the range of specific implementation and application may be changed according to the ideas of the present disclosure. In summary, the content of the specification should not be construed as causing limitations to the present disclosure.

What is claimed is:

1. A flexible display panel, having a display area and comprising:

a flexible substrate;

a thin film transistor layer disposed on the flexible substrate and in the display area and comprising a plurality of insulating layers disposed in a stack, wherein first through-holes penetrating at least one of the insulating layers are formed at a surface of the thin film transistor layer away from the flexible substrate;

an organic planarization layer covering one side of the thin film transistor layer away from the flexible substrate and filled in the first through-holes, and a barrier layer for water and oxygen protection, disposed between the thin film transistor layer and the flexible substrate; wherein the flexible substrate comprises a first flexible substrate, a second flexible substrate, and a blocking layer, the second flexible substrate is disposed between the thin film transistor layer and the first flexible substrate, the blocking layer is disposed between the first flexible substrate and the second flexible substrate, the second flexible substrate is provided with second through-holes penetrating at least a part of the first flexible substrate, and the barrier layer is filled in the second through-holes;

wherein the insulating layers comprise a gate insulating layer, an interlayer insulating layer, a source and drain electrode layer, and a passivation layer, the thin film transistor layer further comprises a semiconductor layer and a gate electrode layer, the semiconductor layer is disposed on the flexible substrate, the gate electrode layer is disposed on one side of the semiconductor layer away or adjacent to the flexible substrate, the gate insulating layer is disposed between the gate electrode layer and the semiconductor layer, the source and drain electrode layer is disposed on one side of the gate electrode layer and the semiconductor layer away from the flexible substrate, the interlayer insulating layer is disposed between the source and drain electrode layer and the semiconductor layer, the passivation layer is disposed on one side of the source and drain electrode layer away from the flexible substrate, and the first through-holes penetrate at least a part of the passivation layer.

2. The flexible display panel according to claim 1, wherein the thin film transistor layer comprises thin film transistors, and the first through-holes are defined adjacent to the thin film transistors.

3. The flexible display panel according to claim 1, wherein the first through-holes penetrate at least a part of the interlayer insulating layer.

4. The flexible display panel according to claim 3, comprising a buffer layer disposed between the insulating layers and the flexible substrate, wherein the first through-holes penetrate at least a part of the buffer layer.

5. The flexible display panel according to claim 1, wherein the first flexible substrate is located on a plane, an orthographic projection of hole walls of the first through-holes on the plane at least partially overlaps an orthographic projection of hole walls of the second through-holes on the plane; or the orthographic projection of the hole walls of the first through-holes on the plane is within the orthographic projection of the hole walls of the second through-holes on the plane.

6. The flexible display panel according to claim 5, wherein the first through-holes and the second through-holes are both circular holes, a diameter of the second through-holes is 4 microns greater than a diameter of the first through-holes.

7. The flexible display panel according to claim 1, wherein a depth of the second through-holes is greater than a depth of the first through-holes.

8. The flexible display panel according to claim 1, wherein the flexible substrate further comprises an adhesive layer disposed between the blocking layer and the second flexible substrate, and the second through-holes penetrate the second flexible substrate to expose the adhesive layer or the blocking layer.

9. The flexible display panel according to claim 8, further comprising a first electrode, a pixel definition layer, a light-emitting layer, and a second electrode, wherein the first electrode is disposed on the thin film transistor layer, the pixel definition layer is disposed on one side of the first electrode away from the thin film transistor layer, openings are formed in the pixel definition layer, the light-emitting layer is disposed in the openings, and the second electrode covers the pixel definition layer and the light-emitting layer.

10. A flexible array substrate, having a display area and comprising:

a flexible substrate;

a thin film transistor layer disposed on the flexible substrate and in the display area and comprising a plurality of insulating layers disposed in a stack, wherein first through-holes penetrating at least one of the insulating layers are formed at a surface of the thin film transistor layer away from the flexible substrate;

an organic planarization layer covering one side of the thin film transistor layer away from the flexible substrate and filled in the first through-holes, and a barrier layer for water and oxygen protection, disposed between the thin film transistor layer and the flexible substrate; wherein the flexible substrate comprises a first flexible substrate, a second flexible substrate, and a blocking layer, the second flexible substrate is disposed between the thin film transistor layer and the first flexible substrate, the blocking layer is disposed between the first flexible substrate and the second flexible substrate, the second flexible substrate is provided with second through-holes penetrating at least a part of the first flexible substrate, and the barrier layer is filled in the second through-holes;

wherein the insulating layers comprise a gate insulating layer, an interlayer insulating layer, a source and drain electrode layer, and a passivation layer, the thin film transistor layer further comprises a semiconductor layer and a gate electrode layer, the semiconductor layer is disposed on the flexible substrate, the gate electrode layer is disposed on one side of the semiconductor layer away or adjacent to the flexible substrate, the gate insulating layer is disposed between the gate electrode layer and the semiconductor layer, the source and drain electrode layer is disposed on one side of the gate electrode layer and the semiconductor layer away from the flexible substrate, the interlayer insulating layer is disposed between the source and drain electrode layer and the semiconductor layer, the passivation layer is disposed on one side of the source and drain electrode layer away from the flexible substrate, and the first through-holes penetrate at least a part of the passivation layer.

11. The flexible array substrate according to claim 10, wherein the thin film transistor layer comprises thin film transistors, and the first through-holes are defined adjacent to the thin film transistors.

12. The flexible array substrate according to claim 10, wherein the first through-holes penetrate at least a part of the interlayer insulating layer.

13. The flexible array substrate according to claim 12, comprising a buffer layer disposed between the insulating layers and the flexible substrate, wherein the first through-holes penetrate at least a part of the buffer layer.

14. The flexible array substrate according to claim 10, wherein the first flexible substrate is located on a plane, an orthographic projection of hole walls of the first through-holes on the plane at least partially overlaps an orthographic projection of hole walls of the second through-holes on the plane; or the orthographic projection of the hole walls of the first through-holes on the plane is within the orthographic projection of the hole walls of the second through-holes on the plane.

15. The flexible array substrate according to claim 14, wherein the first through-holes and the second through-holes are both circular holes, a diameter of the second through-holes is 4 microns greater than a diameter of the first through-holes.

16. The flexible array substrate according to claim 10, wherein a depth of the second through-holes is greater than a depth of the first through-holes.

17. The flexible array substrate according to claim 10, wherein the flexible substrate further comprises an adhesive layer disposed between the blocking layer and the second flexible substrate, and the second through-holes penetrate the second flexible substrate to expose the adhesive layer or the blocking layer.

* * * * *